(12) United States Patent
Izumida et al.

(10) Patent No.: US 6,259,966 B1
(45) Date of Patent: Jul. 10, 2001

(54) COMPONENT FEEDING METHOD AND APPARATUS THEREFOR

(75) Inventors: Keizo Izumida; Takao Kashiwazaki, both of Yamanashi; Hiroki Yamamoto, Kofu, all of (JP)

(73) Assignee: Matsushita Electric Industrial Co., Ltd., Kodoma (JP)

( * ) Notice: Subject to any disclaimer, the term of this patent is extended or adjusted under 35 U.S.C. 154(b) by 0 days.

(21) Appl. No.: 09/171,181

(22) PCT Filed: Apr. 16, 1997

(86) PCT No.: PCT/JP97/01308

§ 371 Date: Oct. 14, 1998

§ 102(e) Date: Oct. 14, 1998

(87) PCT Pub. No.: WO97/39612

PCT Pub. Date: Oct. 23, 1997

(30) Foreign Application Priority Data

Apr. 18, 1996 (JP) .................................................. 8-095771

(51) Int. Cl.[7] .................................................. G06F 07/00
(52) U.S. Cl. ........................ 700/229; 700/228; 700/226; 700/222; 700/219
(58) Field of Search .................................. 700/219, 222, 700/228, 229, 226

(56) References Cited

U.S. PATENT DOCUMENTS

| Re. 33,780 | * | 12/1991 | Itagaki et al. ........................... 29/741 |
| 4,307,832 | * | 12/1981 | Taki et al. ............................... 228/5.1 |
| 4,704,792 | | 11/1987 | Itagaki et al. . |
| 5,044,069 | * | 9/1991 | Asia et al. ............................... 29/740 |
| 5,208,969 | * | 5/1993 | Hidese .................................... 29/740 |
| 5,277,300 | * | 1/1994 | Maggioni ............................... 198/759 |
| 5,930,140 | * | 7/1999 | Asia et al. ......................... 364/468.28 |
| 5,949,681 | * | 9/1999 | Asia et al. .......................... 364/468.2 |
| 5,979,045 | * | 4/2000 | Nishimori et al. ...................... 29/832 |
| 6,047,874 | * | 4/2000 | Asia et al. ............................ 226/110 |

FOREIGN PATENT DOCUMENTS 2-271698    11/1990 (JP) .

* cited by examiner

Primary Examiner—Christopher P. Ellis
Assistant Examiner—Michael E. Butler
(74) Attorney, Agent, or Firm—Wenderoth, Lind & Ponack, L.L.P.

(57) ABSTRACT

As component replacement positions where component feeding tables are replenished with components, are arranged a number of component replacement positions, the number being obtained by substituting a total number of component feeding tables into a specified function. A component feeding table that is not in a component suckup position is moved necessarily to any one of the component replacement positions regardless of the combination of component feeding tables. This component replacement position is determined through steps of setting sequence numbers on the component replacement positions by the specified function based on the distance from the component suckup position, setting sequence numbers and component-replacement direction on the plurality of component feeding tables by a specified function, and giving a specified function the sequence number and component-replacement direction of a component-exhausted component feeding table.

8 Claims, 9 Drawing Sheets

NUMBER OF COMPONENT REPLACEMENT POSITIONS = 4

NUMBER OF COMPONENT REPLACEMENT POSITIONS = 6

NUMBER OF COMPONENT REPLACEMENT POSITIONS = 8

NUMBER OF COMPONENT FEEDING TABLES = 3

NUMBER OF COMPONENT FEEDING TABLES = 4

NUMBER OF COMPONENT FEEDING TABLES = 5

Fig.5

- COMPONENT-REPLACEMENT-POSITION DECISION FUNCTION fp $$fp = \begin{cases} \text{①} & \text{SEARCH FOR A COMPONENT REPLACEMENT POSITION HAVING THE SAME SEQUENCE NUMBER AS THAT OF THE EXHAUSTED COMPONENT FEEDING TABLE IN THE SAME DIRECTION AS THAT OF THE COMPONENT-REPLACEMENT DIRECTION (EXCLUDING ITS OWN POSITION)} \\ \text{②} & \text{THE COMPONENT REPLACEMENT POSITION FOUND BY THE SEARCH IS THE COMPONENT REPLACEMENT POSITION TO WHICH THE EXHAUSTED COMPONENT FEEDING TABLE SHOULD BE MOVED.} \\ \text{③} & \text{IF NOT FOUND, ANOTHER SEARCH IS MADE WITH THE COMPONENT-REPLACEMENT DIRECTION REVERSED AND THE FOUND POSITION IS THE COMPONENT REPLACEMENT POSITION TO MOVE TO.} \end{cases}$$

- EXAMPLE OF COMPONENT REPLACEMENT POSITION DECISION
  (NUMBER OF COMPONENT FEEDING TABLES=4)

500:

| 0 | 1 | 2 | 0 | 1 | 2 | 3 | ← SEQUENCE NUMBER OF COMPONENT REPLACEMENT POSITION |
|---|---|---|---|---|---|---|---|
|   |   |   | 0 | 1 | 2 | 3 | ← SEQUENCE NUMBER OF COMPONENT FEEDING TABLE |
|   |   |   | ← | ← | ← | ← | ← COMPONENT-REPLACEMENT DIRECTION |

↑—510

501:

| 0 | 1 | 2 | 0 | 1 | 2 | 3 |
|---|---|---|---|---|---|---|
| 0 |   |   |   | 1 | 2 | 3 |
| → |   |   | ← |   | ← | ← |

502:

| 0 | 1 | 2 | 0 | 1 | 2 | 3 |
|---|---|---|---|---|---|---|
| 0 | 1 |   | 2 |   |   | 3 |
| → | → |   | ← |   |   | ← |

503:

| 0 | 1 | 2 | 0 | 1 | 2 | 3 |
|---|---|---|---|---|---|---|
| 0 | 1 | 2 | 3 |   |   |   |
| → | → | → | ← |   |   |   |

504:

| 0 | 1 | 2 | 0 | 1 | 2 | 3 |
|---|---|---|---|---|---|---|
| 0 | 1 | 2 | 3 |   |   |   |
| → | → | → | → |   |   |   |

COMPONENT FEEDING METHOD AND APPARATUS THEREFOR

TECHNICAL FIELD

The present invention relates to a component feeding method, as well as an apparatus therefor, for feeding components, which are to be mounted on boards, at their mounting positions in an electronic component mounting machine.

BACKGROUND ART

Component feeding apparatus in electronic component mounting machines are provided in several types, such as taping-compatible, tray-compatible or stick-compatible types depending on the style of packing of electronic components. Among others, the taping-compatible type component feeding apparatuses are capable of feeding electronic components with high speed and in a wide variety of component types, so that they are widely used particularly in high-speed, high-production type mounting machines out of electronic component mounting machines.

Some of the component feeding apparatuses used in high-speed, high-production type mounting machines are equipped with a plurality of component feeding tables.

U.S. Pat. No. 5,208,969 discloses an electronic components feeding device comprising a plurality of tables where feeders of the electronic components are placed, a base where these tables are placed, a first feeding means for moving the tables in lateral direction along which the tables are arranged in a feeding area at central part of the base in order to stop the feeders at pickup position of pick-and-place heads, and a second feeding means for moving the table between retreat areas on the sides of the base and the feeding area.

A further example of the construction of a conventional component feeding apparatus is shown in FIG. 7.

Referring to the individual functional parts in the example of FIG. 7, a plurality of component feeding tables 701 to 704 each have a driving motor incorporated therein one by one, so that the component feeding tables are enabled to operate independently of one another. Each of components placed on each component feeding table is positioned to a component suckup position 709, and fed from the component feeding table to the mounting machine.

As for the component replacement position where electronic components are replenished upon exhaustion of the electronic components on the component feeding table, there are arranged a component replacement position 705 for the component feeding table 701, a component replacement position 706 for the component feeding table 702, a component replacement position 707, for the component feeding table 703, and a component replacement position 708 for the component feeding table 704. When any of the component feeding tables have exhausted components, the component feeding table has to move to its specified component replacement position. Whereas the example of FIG. 7 is shown in a case where the number of motors is the same as that of the component feeding tables in one-to-one correspondence, there are some cases where the number of motors is smaller than that of the component feeding tables.

The purpose of preparing a plurality of component feeding tables is to keep productional operation of the electronic component mounting machine continued without being interrupted and thereby to prevent the machine from lowering in availability even during the periods during which an exhausted component feeding table is moved to the component replacement position and the electronic components are replenished. This is accomplished by, during such periods, feeding the same type of components which have previously been prepared on a component feeding table other than the exhausted component feeding table, not from the exhausted component feeding table but from the other component feeding table to the component suckup position.

For example, the component feeding tables 701 and 702 are used as one set of component feeding tables, and the same components as those placed on the component feeding tables 701 and 702 are placed on the component feeding tables 703 and 704, respectively. Then, the production is started with the set of component feeding tables 701 and 702. Those component feeding tables, upon an occurrence of exhaustion of components, are changed over to the set of the component feeding tables 703 and 704, and the component feeding tables 701 and 702 are moved to the component replacement positions 705 and 706, respectively. Then, replenishing components onto the component feeding tables 701 and 702, if done completely while the production is continued with the component feeding tables 703 and 704, allows the productional operation of the mounting machine to be continued even when the component feeding tables 703 and 704 in turn come to exhaustion of components.

As for the factors in lowering the availability of the equipment, the interruption of productional operation due to exhaustion of the components that are being fed is one of the greatest factors. Therefore, electronic-component mounting equipment has been demanded that the production can be continued as much as possible even upon exhaustion of components, while component replenishment can be carried out. The tooling change at a change of the production model is also a factor that lowers the availability of the electronic-component mounting equipment. As a result, the equipment has also been demanded to carry out the tooling change at the same time as the productional operation or to reduce the working time.

However, with the component feeding method and apparatus therefor of the prior art as described above, there is a need of previously selecting such an operational mode that the combination of component feeding tables is free from any difficulty in continued production upon exhaustion of components, so that the combination of component feeding tables is greatly limited, as an issue.

As an example of those combinations, one combination is shown in FIGS. 8(a)–(d) which shows an operational mode in which production can be continued even when exhaustion of components has occurred to component feeding tables. Referring to FIGS. 8(a)–(d) operational states 800 and 810 show operational modes in which component feeding tables 801 and 802 and component feeding tables 803 and 804 are operated in combination as one set of component feeding tables, respectively. In this operational mode, upon an occurrence of exhaustion of components during the production with the component feeding tables 801 and 802 (shown by the operational state 800), the component feeding tables 801 and 802 are moved to their component replacement positions, while the component feeding tables 803 and 804 are moved to a predetermined specified component suckup position (shown by the operational state 810), and the productional operation of the electronic-component mounting equipment is continued with the components on the component feeding tables 803 and 804.

Also referring to FIGS. 8(c)–(d) operational states 820 and 830 show an operational mode in which component feeding tables 821 and 824 are not used for production. In this operational mode, upon an occurrence of exhaustion of components during the production with a component feeding table 822 (shown by the operational state 820), the component feeding table 822 is moved to its component replacement position, while a component feeding table 823 is moved to the component suckup position (shown by the operational state 830), and the productional operation of the electronic-component mounting equipment is continued with the components on the component feeding table 823.

Given an operational mode in such a combination of component feeding tables as described above, even if exhaustion of components has occurred in the component feeding tables, the productional operation of the electronic-component mounting equipment can be carried out without interruptions. However, with the combination of component feeding tables other than that shown in FIGS. 8(a)–(d) the production would inevitably be interrupted upon occurrences of exhaustion of components, such that the productivity of equipment would be lowered.

For example as shown in FIGS. 9(a)–(c) in an operational mode in which production is started initially with a component feeding table 901 without using component feeding tables 903 and 904 for production and with the same type of components as on the component feeding table 901 placed on a component feeding table 902, even when components have been exhausted during the production with the component feeding table 901 (shown by an operational state 900), the same type components are fed with the component feeding table 902 (shown by an operational state 910) so that the production can be continued without interruption. However, upon exhaustion of components of the component feeding table 902 in this state, if the component replenishment to the component feeding table 901 has been completed, the apparatus can move to the operational state 900 so that the production can be continued, but if the component replenishment to the component feeding table 901 has not been completed yet, the apparatus comes to an operational state 920 such that the productional operation of the equipment would inevitably be interrupted.

Besides, even if the apparatus can move to the operational state 900, components could not be replenished to the component feeding table 902 because the exhausted component feeding table 902 is not in the component replacement position. In this case, in order to execute the component replenishment on the exhausted component feeding table 902, the apparatus would necessarily come to the operational state 920, such that the productional operation would have to be interrupted in the end.

As shown above, an attempt to eliminate the interruption of production upon an occurrence of exhaustion of components in component feeding tables would involve limitations in the combination of component feeding tables as an operational mode for the apparatus, as an issue.

SUMMARY OF THE INVENTION

Accordingly, an object of the present invention is to provide a component feeding method, as well as an apparatus therefor, which are capable of minimizing interruption of production upon an occurrence of component exhaustion and thereby improving the productivity of equipment without limiting the combination of component feeding tables which are provided in a plural number of quantity.

In accomplishing these and other aspects, according to a first aspect of the present invention, there is provided a component feeding apparatus three or more component feeding tables which are replenished with components at component replacement positions; and suction means for sucking a component at a component suckup position and feeding it from a component feeding table to a board; wherein the component feeding tables are arranged in series on a straight line and movable reciprocally along the straight line independently of one another, the component suckup position is provided at the straight line, and the component replacement positions of the component feeding tables are provided at the straight line on both sides of the suckup position;

characterized in that the number of the component replacement positions is (the total number of the using component feeding tables −1)×2; and a control unit is provided for controlling a component-exhausted component feeding table to be moved to a vacant component replacement position.

According to a second aspect of the present invention, there is provided a component feeding method using the above-mentioned component feeding apparatus, wherein the method comprises: setting sequence numbers of the component replacement positions in accordance with their distances from the component suckup position; setting sequence numbers and component-replacement directions of the using component feeding tables in accordance with the set sequence numbers of the component replacement positions; and moving the component-exhausted component feeding table to the determined component replacement position in the component-replacement direction thereof.

Further advantageous embodiments of the present invention are defined in the dependent claims.

With the above arrangement, components can be replenished without interrupting the production upon component exhaustion, by moving a component feeding table that is not in the component suckup position necessarily to any one of the component replacement positions regardless of the combination of component feeding tables.

With the above method, when a component feeding table has exhausted components, components can be replenished without interrupting the production upon component exhaustion, by promptly determining the component replacement position for the exhausted component feeding table and moving to the component replacing work.

In addition, the sequence numbers of component replacement positions are set, for example, by a function as shown as one example in FIG. 3. In addition, the sequence numbers and component-replacement directions of the plurality of component feeding tables are set, for example, by a function such as the one shown in FIG. 4, while the component replacement position for an exhausted component feeding table is determined, for example, by a function such as the one shown in FIG. 5.

BRIEF DESCRIPTION OF THE DRAWINGS

These and other aspects and features of the present invention will become clear from the following description taken in conjunction with the preferred embodiments thereof with reference to the accompanying drawings, in which:

FIG. 5 is an explanatory view of the component-replacement-position decision function in the embodiment;

DETAILED DESCRIPTION OF THE INVENTION

Figure 1:
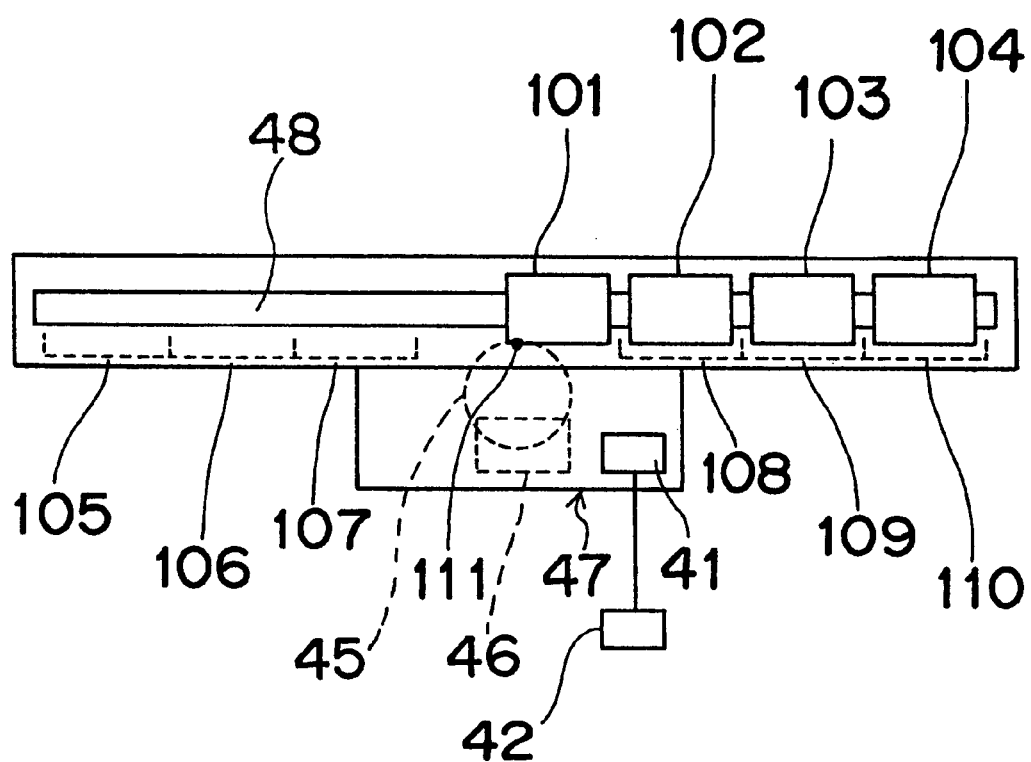
FIG. 1 is a schematic view showing the arrangement of the component feeding apparatus according to an embodiment of the present invention.

Before the description of the present invention proceeds, it is to be noted that like parts are designated by like reference numerals throughout the accompanying drawings.

Hereinbelow, a component feeding method and a component feeding apparatus, which show an embodiment of the present invention, are explained in detail with reference to the accompanying drawings.

FIG. 1 schematically shows production equipment in which the component feeding apparatus of the present embodiment is incorporated. The component feeding apparatus has four component feeding tables 101, 102, 103, 104, and has component replacement positions 105, 106, 107, 108, 109, 110 for occurrences of component exhaustion. Like this, in the case of the production equipment with this arrangement, the number of component replacement positions is six according to Equation 1: (total number of component feeding tables −1)×2 (which is referred to as Equation 1), based on that the total number of component feeding tables is four. This arrangement enables any component feeding table out of a component suckup position 111 to be necessarily located at any one of the component replacement positions 105 to 110. In FIG. 1, reference numeral 45 denotes a rotary head having a plurality of suction heads each for sucking a component at the component suckup position 111, 46 denotes a board to which the suckup component is mounted, 47 denotes a component mounting apparatus, 48 denotes a guide rail for guiding the component feeding tables each having a drive device for reciprocally moving on the guide rail, 41 denotes a control unit of the component mounting apparatus 47 connected to and driving the rotary head 45, all of the component feeding tables and etc., and 42 denotes an input device.

Figure 2:
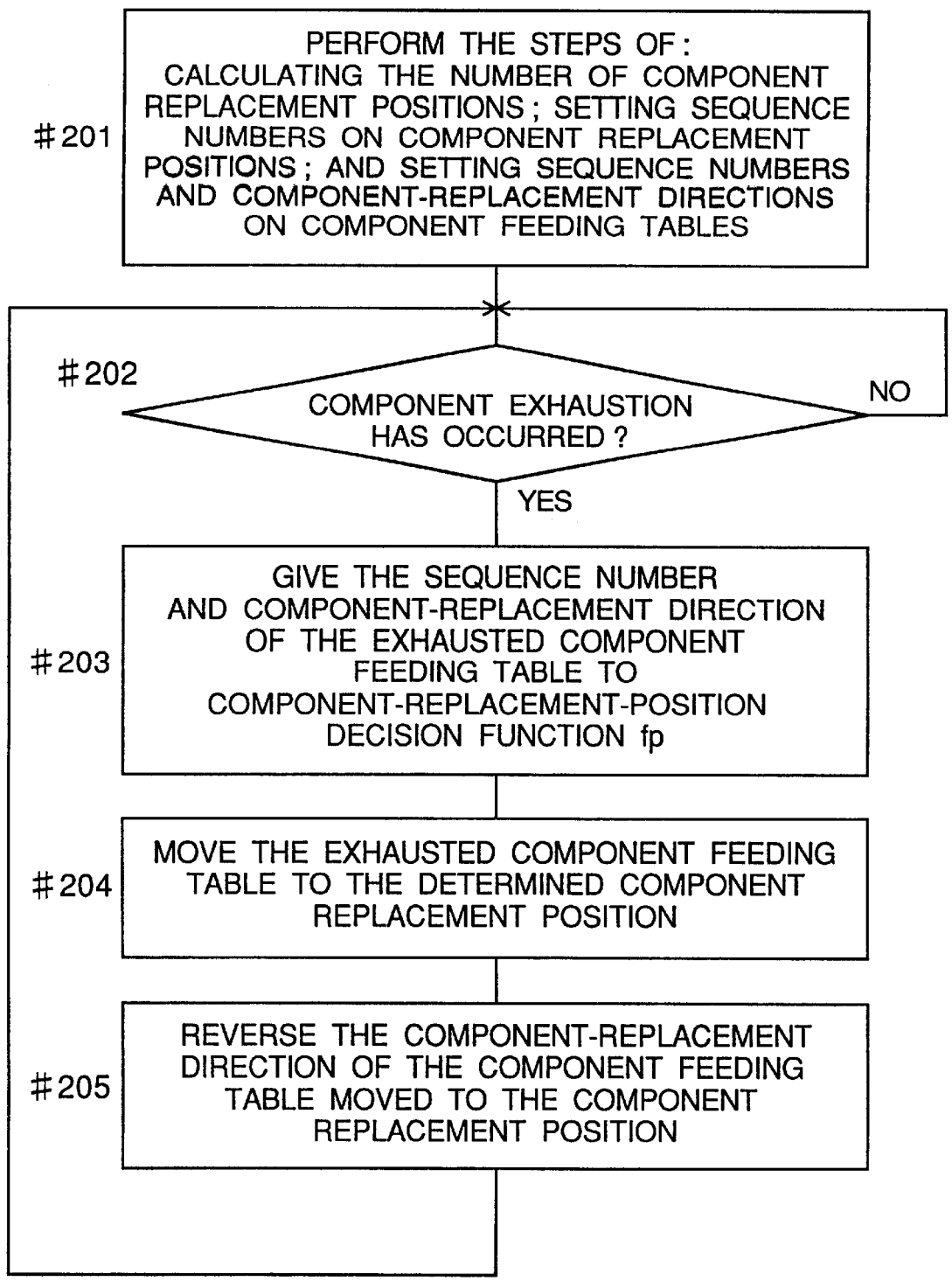
FIG. 2 is a flow chart showing the component feeding method of the embodiment.
Figure 3A:
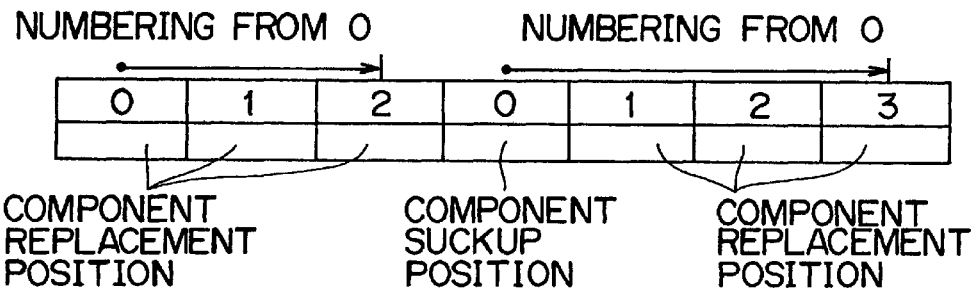
FIGS. 3(a)–(d) are explanatory views of setting the sequence numbers of the component replacement positions in the embodiment.
Figure 3B:
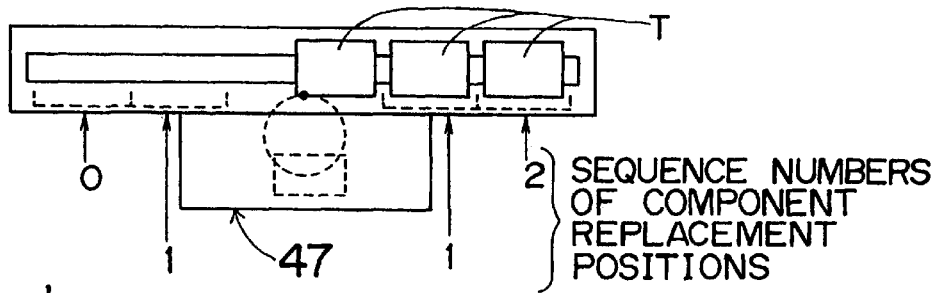
Figure 3C:
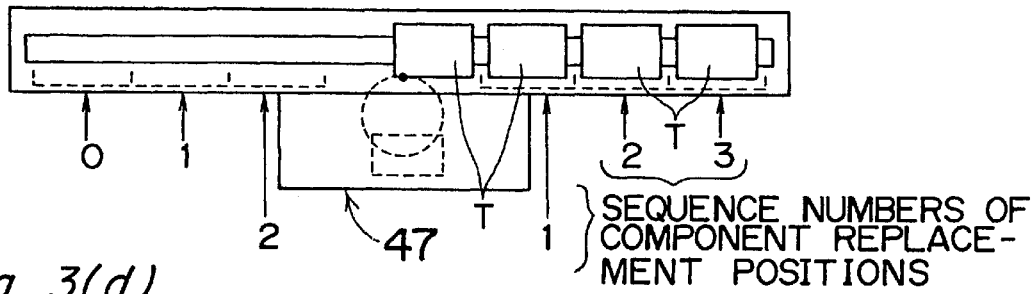
Figure 3D:
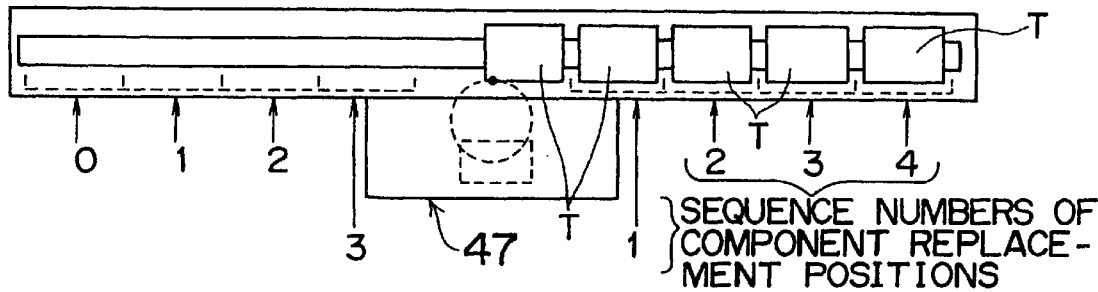

FIG. 2 is a flow chart showing the component feeding method of this embodiment.

Referring to FIG. 2, first, the number of component replacement positions relative to the number of component feeding tables to be used for production is previously calculated. This is intended to allow all the component feeding tables to effectively function at all times in the component feeding apparatus and component feeding method of this embodiment even when out of use in the production. It is essential that the total number of component feeding tables to be used in the production as well as the number of component replacement positions satisfy the function shown in Equation 1. Hereinbelow, in this embodiment, a case is explained in which all the component feeding tables are used for the production as shown in FIG. 1. Further, the setting of sequence numbers of the component replacement positions, the setting of sequence numbers and component-replacement direction on the component feeding tables are determined by functions shown in FIGS. 3 and 4, respectively (step #201).

FIG. 3 gives a simplified explanation of the function for implementing the setting of sequence numbers on the component replacement positions, where examples of the setting of sequence numbers are shown. The setting of sequence numbers on the component replacement positions is accomplished by numbering the component replacement positions in ascending order from 0 in sequence with the component suckup position taken as the start point, and by numbering the rest of the component replacement positions in ascending order from 0 in the opposite direction to the component suckup position. As examples of the setting of sequence numbers on the component replacement positions, there are shown cases where the number of component replacement positions is four, where the number is six, and where the number is eight. In FIG. 3, reference character T denotes a component feeding table.

Figure 4A:
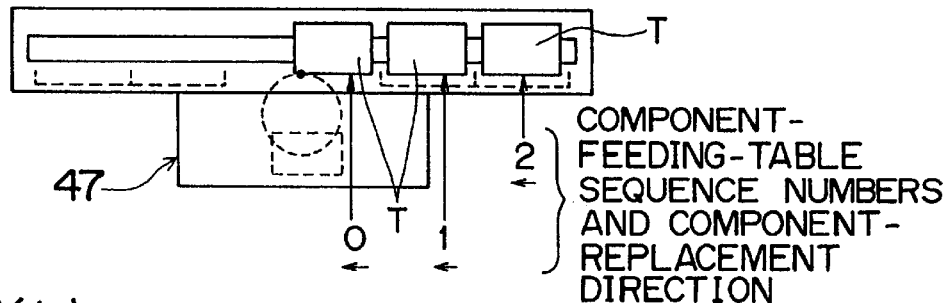
FIGS. 4(a)–(c) are explanatory views of setting the sequence numbers and component-replacement direction on the component feeding tables in the embodiment.
Figure 4B:
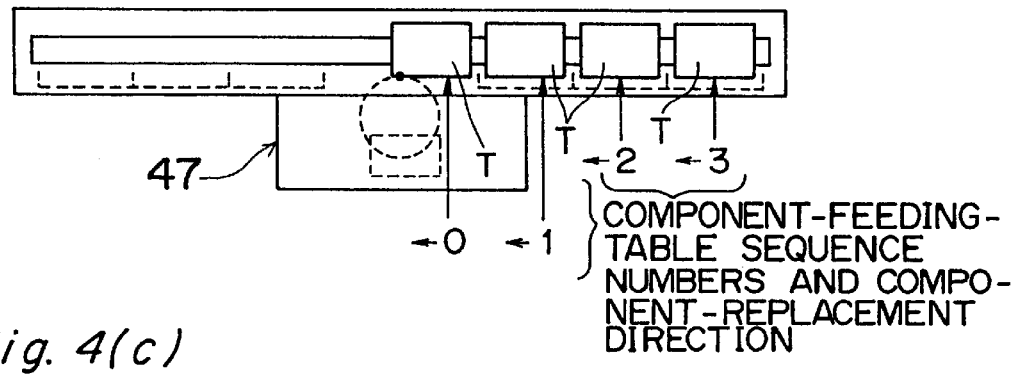
Figure 4C:
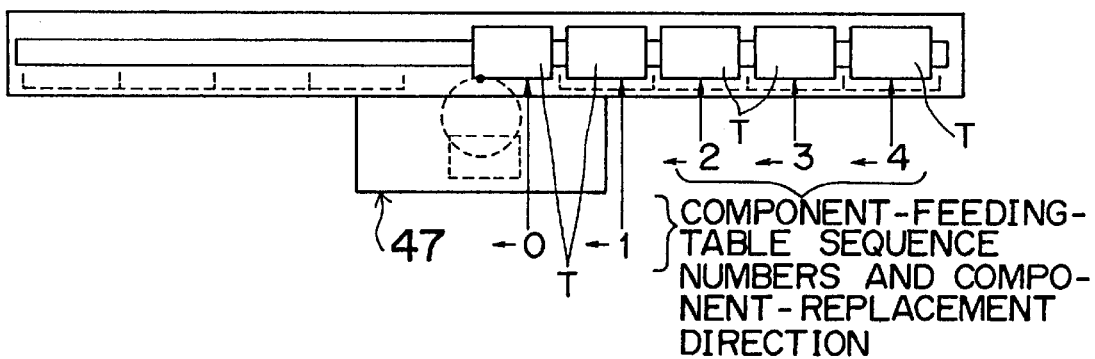

FIG. 4 gives a simplified explanation of the function for setting the sequence numbers and component-replacement direction on the component feeding tables, where examples thereof are shown. The setting of sequence numbers on the component feeding tables has been accomplished by arraying the component feeding tables in a row and by numbering them in ascending order from 0, with their physical direction identical to that of the component replacement positions assigned in FIG. 3. Meanwhile, the component-replacement direction of the component feeding tables has been set by taking, as initial data, an order opposite to the ascending order in which the sequence numbers of component feeding tables are set. As examples of setting the sequence numbers and component-replacement direction on the component feeding tables, there are shown cases where the total number of component feeding tables is three, four and five. In FIG. 4, reference character T denotes a component feeding table.

With these initial settings prepared prior to the start of production by the equipment, the production is started. After waiting for an occurrence of component exhaustion (step #202), when component exhaustion has occurred, the component-feeding-table sequence number and component-replacement direction assigned to the exhausted component feeding table are given to a component-replacement-position decision function fp, so that the component replacement position to which the component feeding table should be moved is determined (step #203). The contents of this component-replacement-position decision function fp are shown in FIG. 5, where an example of decision contents is shown as well. In FIG. 5, for example, upon an occurrence of component exhaustion, if the sequence number of the exhausted component feeding table is 0, i.e., if the 0-placed component feeding table that has currently been in the suckup position has exhausted as shown in a decision state 500, a component replacement position 510 is given as the component replacement position for the relevant component feeding table.

Now that the component replacement position to which the 0-placed component feeding table should be moved has been determined as 510, the exhausted 0-placed component feeding table is moved to the position 510 for replenishing components thereon and a next 1-placed component feeding table is moved to the component suckup position in the determined direction for sequential component mounting operation under a predetermined component mounting program as shown in the state 501 (step #204). Then, the component-replacement direction data of the 0-placed component feeding table moved to the component replacement position 510 is reversed (step #205, decision state 501). This reversal is to move the 0-placed table to a component replacement position reverse to that of the last time upon another occurrence of component exhaustion after the components have been replenished and fed to the component suckup position once again. Then, when the 1-paced component feeding table has exhausted, the 1-placed component feeding table is moved to the 1-placed component replacement position adjacent to the position 510 for replenishing components thereon while the 2-placed component feeding table is moved to the component suckup position for sequential component mounting operation under the component mounting program as shown in the state 502.

In the similar manner, the 2-placed component feeding table is located at the component suckup position and then moved to the component replacement position when it has been exhausted while the 3-placed component feeding table is moved to the component suckup position and the component-replacement direction data of the 3-placed component feeding table moved to the component suckup position is reversed as shown in the states 503 and 504. Then, when the 3-placed component feeding table has exhausted, the 3-placed table is moved to the 3-placed component replacement position for replenishing components thereon while the 2-placed and component-replenished component feeding table is moved to the component suckup position. In such a manner, the 2-placed and 1-placed and component-replenished component feeding tables are sequentially moved to the component suckup position and then the 2-placed and 1-placed component replenishment positions in a manner opposite to the above manner. Then, the 0-placed and component-replenished component feeding table is moved to the component suckup position and the component-replacement direction data of the 3-placed component feeding table moved to the component suckup position is reversed as shown in the state 500. Then, when the 0-placed component feeding table has exhausted, the 0-placed table is moved to the component replacement position 510 as described above. Then, the above manner is repeated under the program.

In order to perform the operations, the component feeding apparatus comprises the control unit 41. The control unit 41 comprises a first part for setting sequence numbers of the component replacement positions 105–110; a second part for setting sequence numbers and component-replacement directions for using component feeding tables 101–104; a third part for determining a component replacement position for the component-exhausted component feeding table; and a fourth part for controlling to move the component-exhausted component feeding table to the determined component replacement position.

The first part is performed to set sequence numbers of the component replacement positions 105–110 based on their distances from the component suckup position 111 by utilizing information inputted by an operator with an input device 42 such as a keyboard or a mouse or information read from a memory or a recording medium such as a CD-ROM. The second part is performed to set sequence numbers and component-replacement directions for using component feeding tables 101–104 based on the set sequence numbers of the component replacement positions 105–110 by utilizing information inputted by the operator with the input device 42 or information read from the memory or the recording medium. The fourth part is performed to determine, upon occurrence of component exhaustion of the component feeding table, a component replacement position for the component-exhausted component feeding table based on the set sequence numbers and component-replacement directions of the component feeding tables. The fourth part is performed to control to move the component-exhausted component feeding table to the determined component replacement position in the component-replacement direction thereof. In the second part for setting the sequence numbers and component-replacement directions of the using component feeding tables based on the set sequence numbers of the component replacement positions, the sequence numbers of the component feeding tables are determined in ascending order from 0 in the same direction as that in which the sequence numbers of the component replacement positions have been set and the component replacement direction of the component feeding table is determined in a direction opposite to the ascending-order direction in which the sequence numbers of the component replacement positions have been set, and in the second part for setting the sequence numbers and component-replacement directions of the utilized component feeding tables, the component replacement position for the component-exhausted component feeding table is assigned a component replacement position having the same sequence number as the sequence number of the component feeding table searched out in the same direction as the component-replacement direction of the component feeding table.

The above operation will be effected each time component exhaustion occurs. Thus, by replenishing components in the component feeding table that is in the component replacement position upon component exhaustion in turns at the component replacement position, the equipment is enabled to run for a long time without lowering the equipment productivity.

Although the above embodiment has been described by way of example on a case where four component feeding tables are involved, the component feeding apparatus can produce similar effects with a similar concept only if the component feeding apparatus has three or more component feeding tables.

A component feeding method, as well as an apparatus therefor, which show another embodiment different from the foregoing embodiment, are explained below with reference to the accompanying drawings.

FIGS. 6(*a*)–(*c*) show the component feeding apparatus of a modification of the present invention, where the component feeding method of the present embodiment is applied to an operation in which part of the component feeding tables are used. This is a case where only component feeding tables 601 and 602 are used for production by the equipment, and component feeding tables 603 and 604 are not used for production by the equipment. Since the number of component feeding tables is two, it can be seen from Equation 1 that the necessary number of component replacement positions is two. Therefore, only two out of the component replacement positions shown in an operational state 600 of FIG. 6 are used. In terms of the arrangement of the component feeding apparatus in this embodiment, the component feeding tables and the component replacement positions in the component feed section are discussed on line as shown in FIGS. 3 and 4, and their positional relationship is set with a component suckup position Q1 interposed therebetween. This gives rise to a need of neglecting component replacement positions 606 and 607 as excess component replacement positions. The result is that the component feeding apparatus of this embodiment is applied with the component replacement positions provided as two, 605 and 608.

Figure 6A:
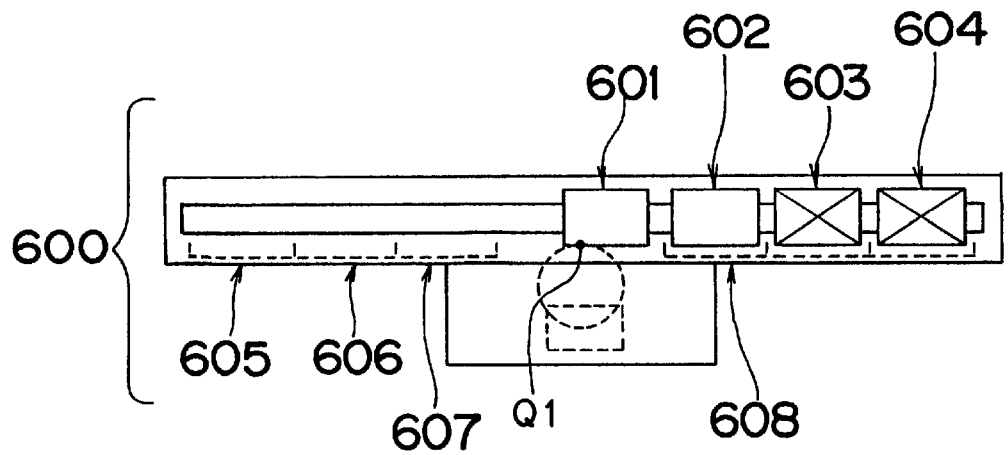
FIGS. 6(a)–(c) are explanatory views of the component feeding method according to an another embodiment of the present invention.
Figure 6B:
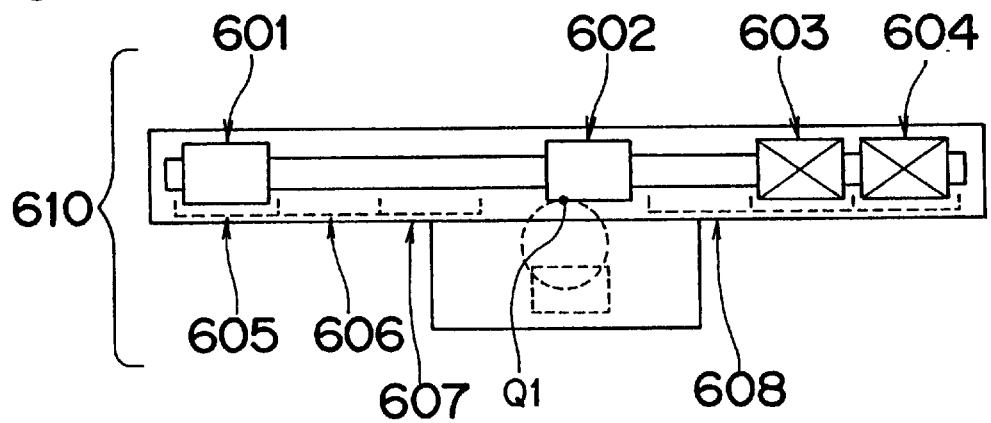
Figure 6C:
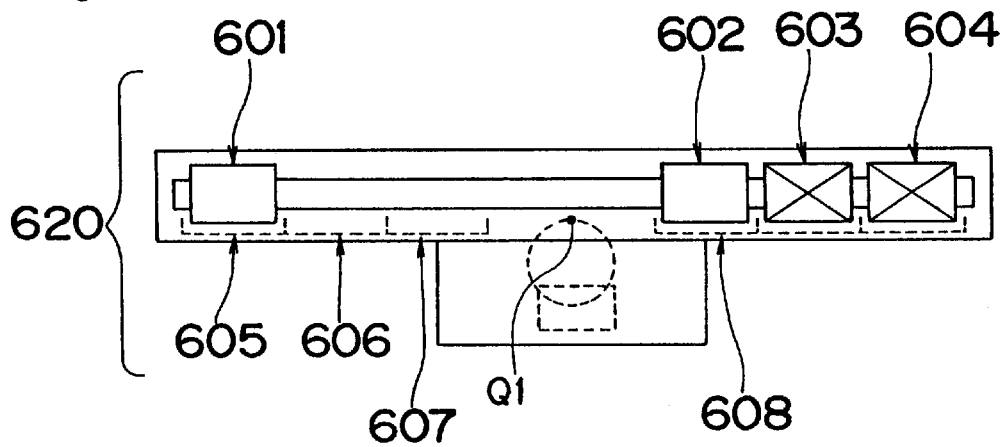
Figure 7:
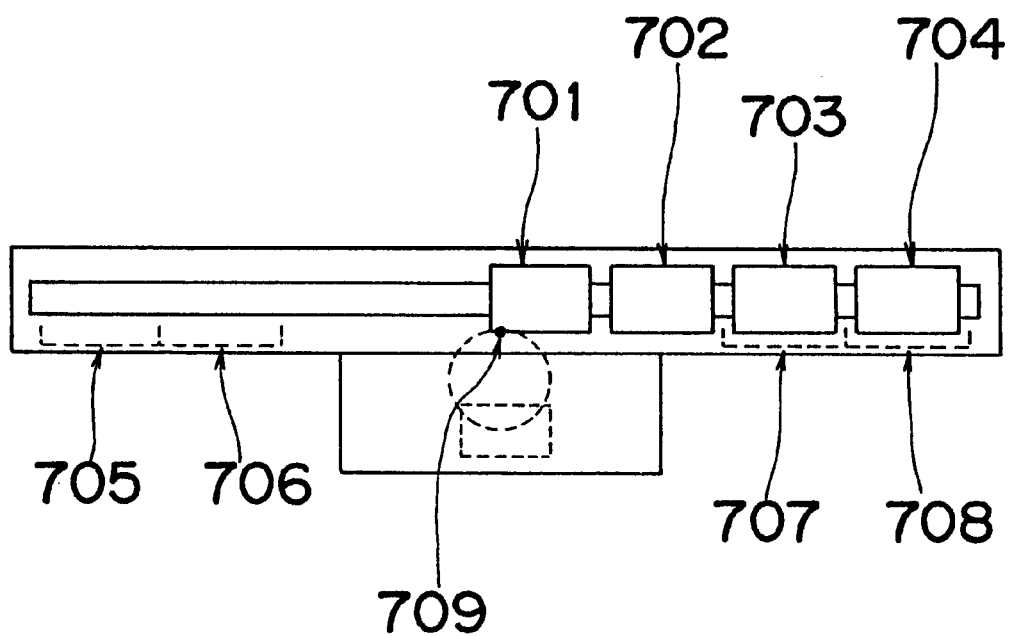
FIG. 7 is a schematic view showing the arrangement of a component feeding apparatus according to the prior art.
Figure 8A:
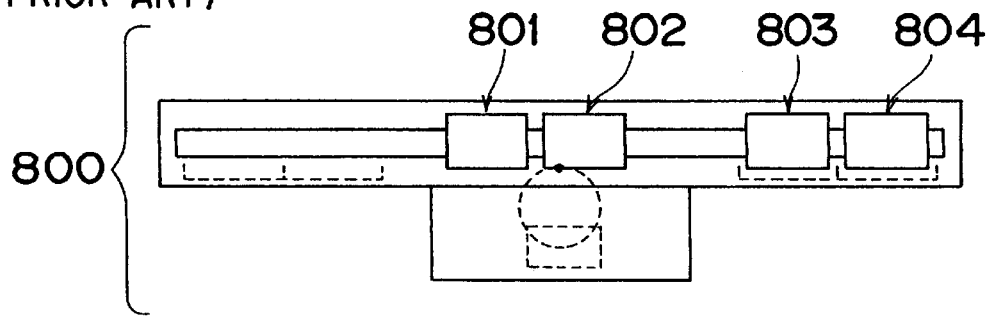
FIGS. 8(a)–(d) are explanatory views of a component feeding method according to the prior art.
Figure 8B:
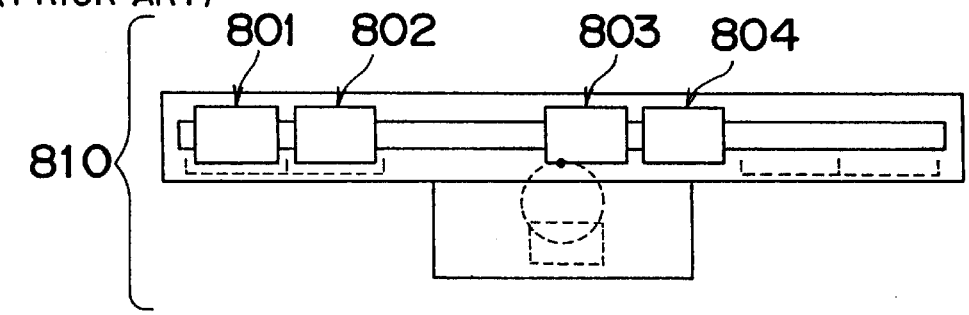
Figure 8C:
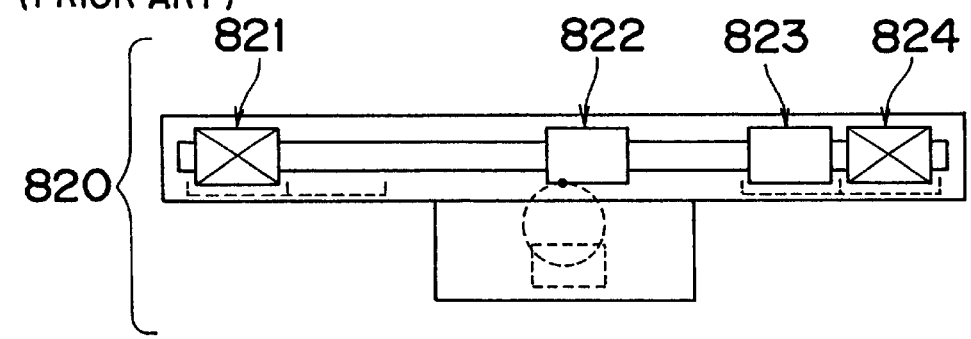
Figure 8D:
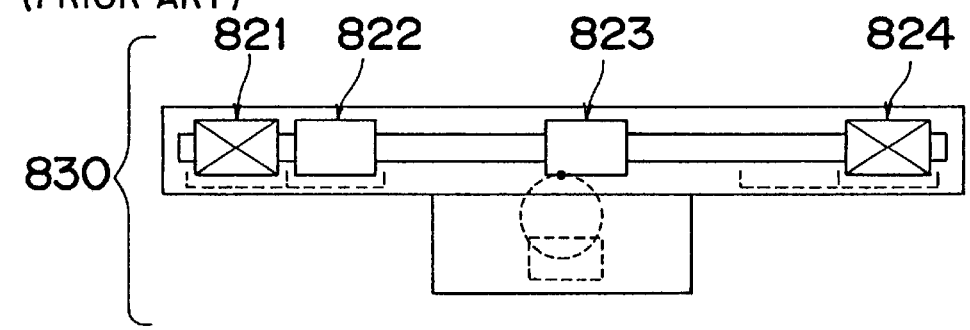

In an application of the component feeding apparatus of this embodiment to the operational mode of FIGS. 6(a)–(c) with the assumptions as shown above, upon an occurrence of component exhaustion in the operational state 600, the component feeding table 601 moves to the component replacement position 605 (shown by operational state 610). Then, the production is continued with the component feeding table 602. When the component feeding table 602 comes to component exhaustion, the apparatus comes to an operational state 620. At this time point, if the component feeding table 601 has completed the component replenishment, the production can be continued without interruption.

Figure 9A:
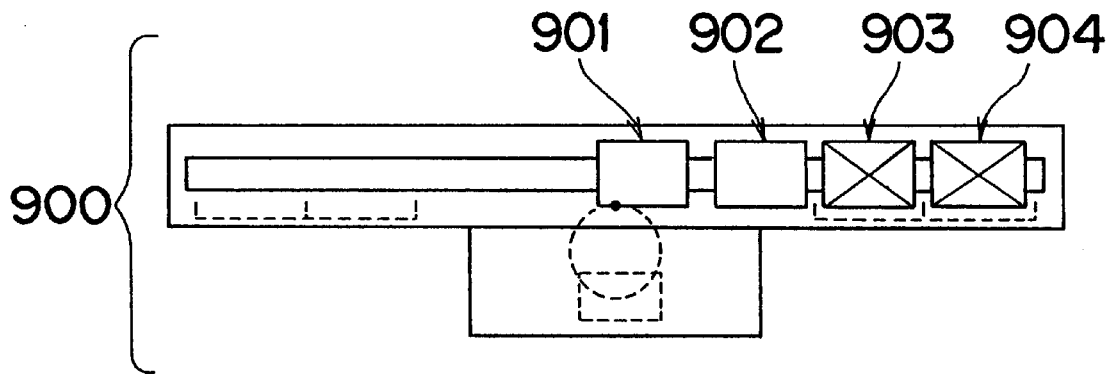
FIGS. 9(a)–(c) are explanatory views of another component feeding method according to the prior art.
Figure 9B:
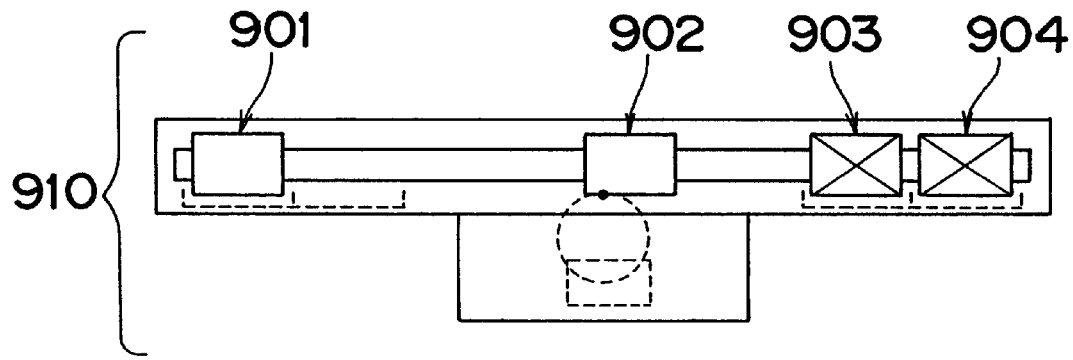
Figure 9C:
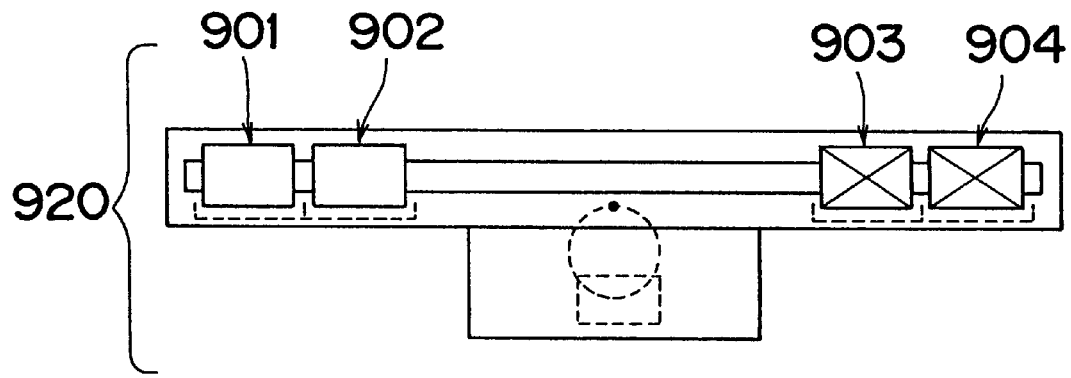

As shown above, it can be understood that, whereas the production would be interrupted upon component exhaustion of the component feeding table 601 with the conventional component feeding apparatus (see FIGS. 9(a)–(c), the production can be continued without interruption according to the component feeding method of this embodiment.

As described hereinabove, according to the present invention, components can be replenished without interrupting the production upon component exhaustion, by moving a component feeding table that is not in the component suckup position necessarily to any one of the component replacement positions regardless of the combination of component feeding tables.

Also, when a component feeding table has exhausted components, components can be replenished without interrupting the production upon component exhaustion, by promptly determining the component replacement position for the exhausted component feeding table and moving to the component replacing work.

Therefore, interruption of production upon component exhaustion can be eliminated as much as possible without limiting the combination of component feeding tables provided to a plural number of quantity, so that the equipment productivity can be improved.

In the embodiments, the component feeding tables of the same number, for example, a number of (the total number of the using component feeding tables −1) are preferably disposed at each of both sides of the composition suckup position.

What is claimed is:

1. A component feeding apparatus comprising:
   a plurality of component replacement positions;
   three or more component feeding tables which are replenished with components at the component replacement positions;
   a suction device for sucking a component at a component suckup position and feeding the component from one of the component feeding tables to a board,
   wherein the component feeding tables are arranged in series along a straight line and movable reciprocally along the straight line independently of one another,
   the component suckup position is provided on the straight line, and
   the component replacement positions of the component feeding tables are provided on the straight line on both sides of the suckup position;
   characterized in that the number of the component replacement positions is equal to; (the total number of utilized component feeding tables −1)×2; and
   a control unit for controlling movement of a component-exhausted component feeding table to a vacant component replacement position.

2. The apparatus as claimed in claim 1, wherein the control unit is further operable to set sequence numbers of the component replacement positions in accordance with their distances from the component suckup position;
   set sequence numbers and component-replacement directions of the utilized component feeding tables in accordance with the set sequence numbers of the component replacement positions;
   determine, upon an occurrence of component exhaustion of a component feeding table, a component replacement position for the component-exhausted component feeding table in accordance with the set sequence numbers and component-replacement directions of the component feeding tables; and
   control movement of the component-exhausted component feeding table to the determined component replacement position in the component-replacement direction thereof.

3. The apparatus as claimed in claim 2, wherein the control unit is further operable to determine the sequence numbers of the component feeding tables in ascending order from zero (0) in the same direction as that in which the sequence numbers of the component replacement positions have been set, and the component replacement direction of the component feeding table in a direction opposite to the ascending-order direction in which the sequence numbers of the component replacement positions have been set, when setting the sequence numbers and component-replacement directions of the using component feeding tables in accordance with the set sequence numbers of the component replacement positions, and for assigning the component replacement position for the component-exhausted component feeding table to a component replacement position having the same sequence number as the sequence number of the component feeding table searched out in the same direction as the component-replacement direction of the component feeding table, when setting the sequence numbers and component-replacement directions of the utilized component feeding tables.

4. A component feeding apparatus comprising:
   a plurality of component replacement positions;
   three or more component feeding tables which are replenished with components at the component replacement positions;
   a suction device for sucking a component at a component suckup position and feeding the component from one of the component feeding tables to a board,
   wherein the component feeding tables are arranged in series along a straight line and movable reciprocally along the straight line independently of one another,
   the component suckup position is provided on the straight line, and
   the component replacement positions are provided on the straight line, and the same number of component replacement positions are provided on both sides of the component suckup position, and
   the number of component replacement positions on each side of the component suckup position is equal to; (the total number of utilized component feeding tables −1); and
   a control unit for controlling movement of a component-exhausted component feeding table to a vacant component replacement position.

5. A component feeding apparatus as claimed in claim 4, wherein the control unit is operable to control, when the component feeding table positioned at the component replacement position is moved to the component suckup position to be subjected to component supply and components of the component feeding table are exhausted, the component-exhausted component feeding table is moved to the component replacement position for component replenishment that is located at an opposite side of the component suckup position relative to the component feeding table positioned at the component replacement position, and then is subjected to component replenishment.

6. A component feeding apparatus as claimed in claim 5, wherein the control unit is operable to control movement of the component-exhausted component feeding table at the component suckup position to the component replacement position that is farthest from the component suckup position and at which no component feeding table is located, and then to make the component-exhausted component feeding table be subjected to component replenishment.

7. A component feeding method using a component feeding apparatus including three or more component feeding tables that are replenished with components at component replacement positions, and a suction device for sucking a component at a component suckup position and feeding the component from a component feeding table to a board, the method comprising:

setting sequence numbers of the component replacement positions in accordance with their distances from the component suckup position;

setting sequence numbers and component-replacement directions of the utilized component feeding tables in accordance with the set sequence numbers of the component replacement positions; and moving a component-exhausted component feeding table to the determined component replacement position in the component-replacement direction thereof.

8. The method as claimed in claim 7, wherein, in setting the sequence numbers and component-replacement directions of the using component feeding tables in accordance with the set sequence numbers of the component replacement positions, the sequence numbers of the component feeding tables are determined in ascending order from O in the same direction as that in which the sequence numbers of the component replacement positions have been set and the component replacement direction of the component feeding table is determined in a direction opposite to the ascending-order direction in which the sequence numbers of the component replacement positions have been set, and, in setting the sequence numbers and component-replacement directions of the using component feeding tables, the component replacement position for the component-exhausted component feeding table is assigned a component replacement position having the same sequence number as the sequence number of the component feeding table searched out in the same direction as the component-replacement direction of the component feeding table.

\* \* \* \* \*